United States Patent
Li

(10) Patent No.: US 8,947,137 B2
(45) Date of Patent: Feb. 3, 2015

(54) CORE VOLTAGE RESET SYSTEMS AND METHODS WITH WIDE NOISE MARGIN

(71) Applicant: NVIDIA Corporation, Santa Clara, CA (US)

(72) Inventor: Alan Li, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/730,668

(22) Filed: Dec. 28, 2012

(65) Prior Publication Data

US 2014/0062547 A1    Mar. 6, 2014

Related U.S. Application Data

(60) Provisional application No. 61/697,283, filed on Sep. 5, 2012.

(51) Int. Cl.
| | |
|---|---|
| *H03L 7/00* | (2006.01) |
| *H03L 9/00* | (2006.01) |
| *H01L 25/03* | (2006.01) |
| *H03K 17/687* | (2006.01) |
| *H03K 19/0175* | (2006.01) |
| *H03K 19/0185* | (2006.01) |

(52) U.S. Cl.
CPC *H03L 9/00* (2013.01); *H01L 25/03* (2013.01); *H03K 17/687* (2013.01); *H03K 19/017509* (2013.01); *H03K 19/018507* (2013.01)

USPC .......................................... 327/142; 327/198

(58) Field of Classification Search
CPC ...... H03K 17/20; H03K 17/22; H03K 17/223
USPC .......................................... 327/142, 143, 198
See application file for complete search history.

(56) References Cited

U.S. PATENT DOCUMENTS

| | | | | |
|---|---|---|---|---|
| 5,233,613 | A * | 8/1993 | Allen et al. | 714/55 |
| 5,569,903 | A * | 10/1996 | Matsubara | 235/492 |
| 8,570,077 | B2 * | 10/2013 | Kwon et al. | 327/143 |
| 2013/0176065 | A1 * | 7/2013 | Balmelli | 327/198 |

* cited by examiner

*Primary Examiner* — William Hernandez

(57) ABSTRACT

Presented systems and methods facilitate efficient reset operation. In one embodiment, a system comprises a core domain portion an I/O domain portion and a core reset I/O by-pass component. The core domain portion is configured to operate at a nominal core domain voltage level. The I/O domain portion configured to operate at a nominal I/O domain voltage level. The core reset I/O by-pass component configured to forward a reset indication to the core domain independent of the I/O domain. In one exemplary implementation the core reset I/O by-pass component is operable to receive an input reset indication at a high domain voltage level and to convert the input reset indication to a core reset signal that is less than or substantially equal to the nominal core domain voltage, wherein the high domain is voltage higher than the core domain voltage level.

20 Claims, 5 Drawing Sheets

500

Receiving a Reset Indication at a Voltage Level that is Not Safe for a Core Domain and Forwarding the Reset Indication to a Core Domain at Voltage Level That is Safe for the Core Domain

510

Performing a Voltage Level Restoration Process

520

Performing a Noise Margin Amplification Process

CORE VOLTAGE RESET SYSTEMS AND METHODS WITH WIDE NOISE MARGIN

The present application claims the benefit and priority of U.S. provisional application No. 61/697,283 (NVID-SC-11-0180-81-US-PRO), entitled "Schmitt Receiver for High-Voltage Input Signals And Core Voltage Reset Circuit With Wide Noise Margin," filed on Sep. 5, 2012, which is incorporated herein by this reference.

TECHNICAL FIELD

The present disclosure relates generally to the field of integrated circuits and more specifically to the field of providing reset signals to integrated circuits.

BACKGROUND

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. These devices often include a plurality of power domains with some of the power domains operating at different voltages. Some conventional integrated circuits with split power rail approaches have different power domains receiving different power supply voltages from respective different power rails. Conventional attempts at coordinating operations at the different voltage levels can be complicated and problematic.

The power domains can include a variety of functional components configured to operate at the different respective voltage levels. Some traditional systems include core power domains with functional components configured to operate at a lower voltage level than an input/output (I/O) domain. Conventional core circuits usually have to communicate with devices external to the integrated circuit through the I/O circuits to avoid damage and conventional coordination of operations in the two different domains can be problematic. For example, it is often beneficial to reset core functional components to ensure the core functional components start up in a known or predetermined state (thereby facilitating predictable results) rather than random states and unreliable results. However, conventional approaches of communicating a reset indication though traditional I/O functional components of the I/O domain can give rise to a number of issues. For example, a reset can take longer and consume more power while the I/O domain is brought up. In addition, external signals often have relatively large noise that can pose significant problems for core domains.

SUMMARY

Presented systems and methods facilitate efficient reset operation. In one embodiment, a system comprises a core domain portion an I/O domain portion and a core reset I/O by-pass component. The core domain portion is configured to operate at a nominal core domain voltage level. The I/O domain portion configured to operate at a nominal I/O domain voltage level. The core reset I/O by-pass component configured to forward a reset indication to the core domain independent of the I/O domain. In one exemplary implementation the core reset I/O by-pass component is operable to receive an input reset indication at a high domain voltage level and to convert the input reset indication to a core reset signal that is less than or substantially equal to the nominal core domain voltage, wherein the high domain is voltage higher than the core domain voltage level.

In one embodiment, the reset protection circuit can include a level restoration circuit operable to pull the converted reset signal up to the core domain voltage level. The high domain voltage can be equal to the I/O domain voltage level. The core logic portion can be operable to receive the converted reset signal before the I/O domain rail is powered up. The reset protection circuit comprises a native thick oxide N channel transistor connected in series with a thin channel transistor, wherein both the transistors have a gate coupled to the core domain voltage level; and wherein the native thick oxide N channel transistor has a threshold voltage substantially equal to or less than zero. The noise margin amplification circuit comprises as a half-Schmitt trigger circuit operable to increase the Voltage-In-Low of the core logic portion in response to the converted reset signal.

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 5 is a block diagram of exemplary core reset I/O by-pass method in accordance with one embodiment of the present invention.

DETAILED DESCRIPTION

Figure 1:
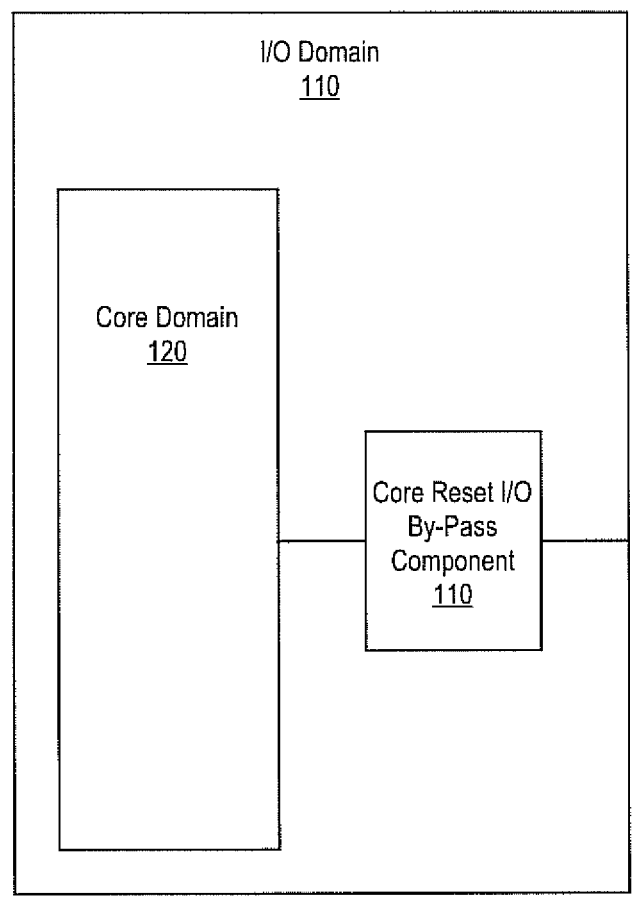
FIG. 1 illustrates the configuration of a split rail integrated circuit that comprises a reset by-pass circuit in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Presented systems and methods enable effective and efficient coordination of component resets. In one embodiment, a reset indication can propagate to core domains before bringing up the I/O domain components. In one exemplary implementation, propagating the reset indication to the core before bringing up the I/O domain components reduces start up time and power consumption. In one embodiment, systems and methods also enable reset with wide noise margins.

FIG. 1 is a block diagram of exemplary system 100 in accordance with one embodiment of the present disclosure. System 100 includes I/O domain 110, core domain 120 and core reset I/O by-pass component 130. The I/O domain 110 is electrically coupled to core domain 120 which is electrically coupled to core reset I/O bypass component 130. The components of system 100 cooperatively operate to perform a variety of functions including efficient reset. The I/O domain 110 is operable to perform various I/O functions with exterior components (not shown). The core domain 120 is operable to perform various core functions. The core reset I/O by-pass component 130 is operable to forward a reset indication for the core domain 120 independent of the I/O domain 110.

In one exemplary implementation, the core reset I/O by-pass component 130 is operable to forward a reset indication before I/O domain 110 comes up. In one exemplary implementation, the core reset I/O by-pass component 130 is operable to receive a reset indication at a voltage level different than the core domain voltage level and provide a corresponding core reset indication to the core at a voltage level safe for the core domain. In one embodiment, the reset I/O by-pass component 130 receives an external reset indication at a voltage level comparable to the I/O domain voltage level and forwards the core reset indication to the core at a nominal core voltage value.

Figure 2:
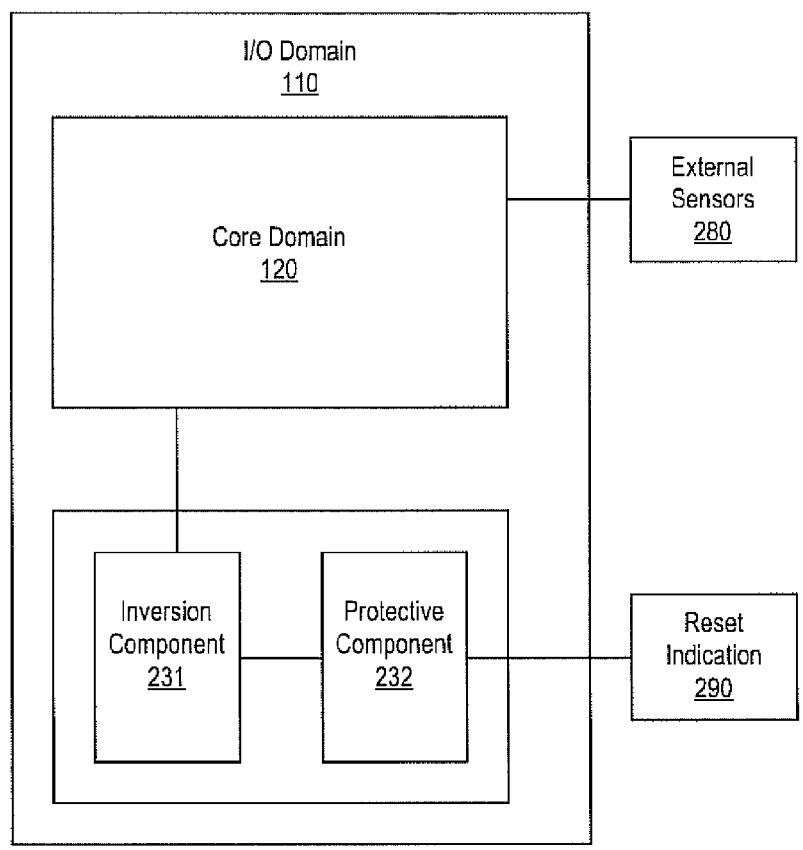
FIG. 2 illustrates a system of resetting core domain circuits with a reset signal sent from a global reset chip circuit without powering up the I/O domain circuits in accordance with an embodiment of the present disclosure.

FIG. 2 is a block diagram of exemplary system 200 in accordance with one embodiment of the present disclosure. System 200 includes I/O domain 210, core domain 220 and core reset I/O by-pass component 230. In one embodiment, system 200 is similar to system 100. In one embodiment, core reset I/O by-pass component 230 includes inversion component 231 and protection component 232. In one exemplary implementation, protection component 232 ensures a reset indication is forwarded to the core domain at a voltage level that is safe for the core domain, even if the reset indication is received by the core reset I/O by-pass circuit 230 at a voltage level that is not safe for the core domain 220. It is appreciated that the protection component 232 can operate in a variety of ways (e.g., limit the voltage of the reset indication, convert the voltage of the reset indication, etc.). In one embodiment, inversion component 231 inverts a signal associated with the reset indication to a logical level consistent with the logic of the core domain 220. In one exemplary implementation, if the core domain 220 treats a logical 0 indication as a reset indication, inversion component 231 inverts a reset indication to a logical 0 indication.

In one embodiment, system 200 includes a split rail configuration in accordance with an embodiment of the present disclosure. The integrated circuit can include core domain components operating at the core domain voltage VDDC, I/O domain logic components operating at the I/O domain voltage VDDO. The core reset I/O by-pass circuit 230 can receive reset indications at voltages comparable to the nominal I/O domain voltage VDDO and can output reset indications at nominal voltages comparable to the core domain voltage VDDC. It is appreciated that the VDDO (e.g., nominal 1.8V, 2.2V, 3.3V, etc.) and VDDC (e.g., nominal 1.0V, 1.2V, etc.) can be at different levels. The VDDO can be higher than the VDDC or vise versa. In one embodiment, the external signals 208 can operate at VDDE and can be forwarded to the I/O domain 210. In one exemplary implementation, after the I/O domain has been brought up and is operational the I/O domain 210 can forward the external signals 208 to the core domain 220 at a voltage safe for the core domain 220.

In one embodiment, an external reset indication essentially circumvents the I/O domain logic while proceeding independently with a reset or power up of the core domain logic circuits to their predictable default operation status. In one exemplary implementation, the I/O domain logic can be subsequently powered up or reset according to the default values sent from the core domain logic. The process can ensure the I/O domain logic is powered up in a controlled process without the issues of leakage currents. As a result, power consumption is reduced. Moreover, in one embodiment during a core reset process, the I/O rail is not required to power up before the input reset signal can be asserted to reset the core circuits and the overall time that the core domain logic requires to respond to the reset signal is reduced.

Figure 4:
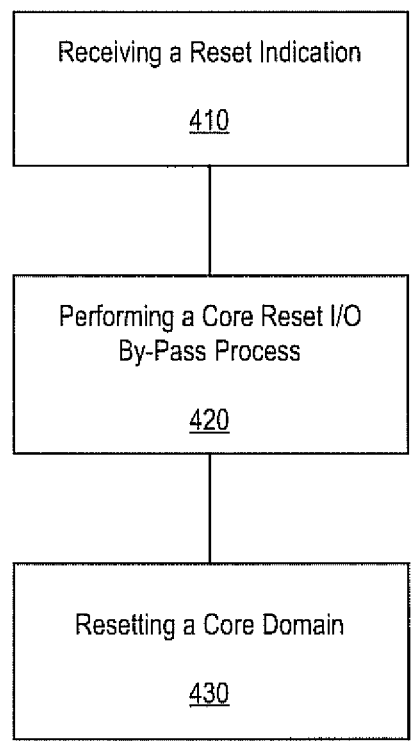
FIG. 4 is a block diagram of exemplary core reset method in accordance with one embodiment of the present invention.

FIG. 4 is a block diagram of exemplary core reset I/O by-pass method 400 in accordance with one embodiment of the present invention.

In block 410, a reset indication is received. In one embodiment, a reset indication is received from an external source. In one exemplary implementation, the reset indication is an input reset signal at a high voltage domain VDDH as first received.

In block 420, a core reset I/O by-pass process is performed. In one embodiment, a core reset I/O by-pass process forwards a reset to a core domain independent of the I/O domain. In one embodiment, a core domain is protected from a reset indication signal that is at an unsafe voltage level. In one exemplary implementation, a core reset indication is forwarded at a voltage level safe for core domain logic.

In block 430, a core domain is reset. In one embodiment, core functional components are reset to start up in a known or predetermined state (thereby facilitating predictable results) rather than random states and unreliable results.

In one embodiment, the I/O rail can be either powered up or powered down while the core rail is powered up.

FIG. 5 is a block diagram of exemplary core reset I/O by-pass method 500 in accordance with one embodiment of the present invention. Core reset I/O by-pass method 500 can be performed independent of I/O domain operations. Core reset I/O by-pass method 500 is similar to block 420 of core reset I/O by-pass method 400.

In block 510, a reset indication received at a voltage level that is not safe for a core domain is forwarded to the core domain at voltage level that is safe for the core domain. In one embodiment, the reset signal is converted to a low power domain level that is compatible with the core domain logic. The converted reset signal may be lower than the nominal VDDC due to the threshold voltage of the transistor used in the protection circuit, as will be discussed in details below.

In block 520 a voltage level restoration process is performed. In one embodiment, the converted reset signal is then pulled up to the nominal VDDC level.

In block 530 a noise margin amplification process is performed. In one embodiment, because the converted reset signal may still carry a relatively large noise range (e.g., similar to the input reset signal), the core domain logic noise margin is amplified accordingly so that the core domain logic can correctly read the forwarded reset signal. Traditional core domains often operate with relatively small noise margins (e.g., 200 mV. etc.) while the presented noise margin amplification process can accommodate relatively large noise margins (e.g., 400 mV, etc.).

Figure 3:
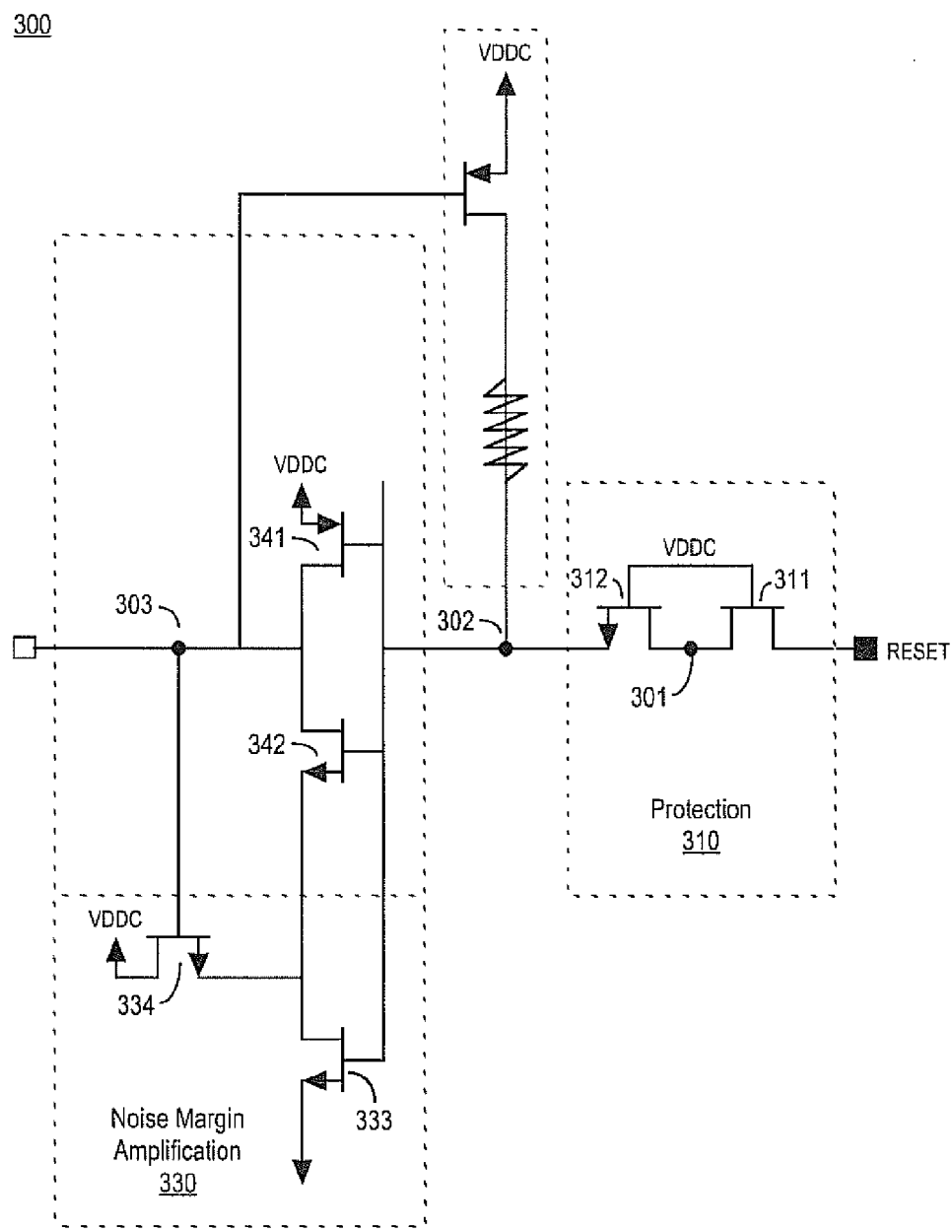
FIG. 3 illustrates the configuration of a reset by-pass circuit that is capable of forwarding a reset signal sent from the global reset chip circuit without powering up the I/O rail in accordance with an embodiment of the present disclosure.

FIG. 3 is a block diagram of exemplary core reset I/O by-pass system 300 in accordance with one embodiment of the present disclosure. Core reset I/O by-pass system 300 includes a protection circuit 310, a level restoration circuit 320 and an inverter 330. In one embodiment, the inverter 330 includes noise margin amplification circuit 340.

The protection circuit 310 includes a thick layer oxide NMOS 311 coupled in series to a thin layer oxide NMOS 311, both having the gate coupled to the VDDC. The protection circuit 310 receives an external input reset signal through the drain of the NMOS 311. In one exemplary implementation the reset signal comes from a global chip reset circuit (not shown). The NMOS 311 is selected such that it is capable of operating at the VDDC but can reliably tolerate the VDDH level without suffering unacceptable oxide stress. Limited by the threshold voltage of the NMOS 311, Vth_thick, the reset signal is reduced to be approximately equal to or less than VDDC-Vth_thick at node 301 between the NMOS 311 and the NMOS 312. In order to preserve the reset signal to a level that is high enough to drive the other components of the reset by-pass circuits and the core logic, the NMOS 311 with a relatively small Vth_thick may be employed. In some embodiments, a thick layer native oxide NMOS can be employed as NMOS 311 which is characteristic of a low and even negative threshold voltage (e.g., 0-200 mV, etc.). In one exemplary implementation, a voltage of 1.2V results at node 30 and the thin layer NMOS 312 thus receives a voltage no more than VDDC-Vth_thick at node 301 which poses no or minimal risk of oxide stress for the core domain circuits. Similarly limited by the threshold of the NMOS 312, the reset signal at 302 is converted to a reset signal of approximately equal to or less than VDDC-Vth_thin. In this configuration, the two NMOS transistors act like a single NMOS with a threshold of Vth_thin and capable of tolerating the input reset signal at VDDH.

The restoration circuit 320 includes a PMOS 321, a large resistor 322. The PMOS 321 has the source coupled to VDDC, the drain coupled to the output of the protection circuit 310 at node 302 which is also the input of the inverter 330, and the gate coupled to the output of the inverter 330 at node 303.

Inverter 303 includes a PMOS 341, NMOS 342 and noise margin amplification circuit 340. In the embodiment illustrated in FIG. 3, a Schmitt-trigger circuit is included in the noise amplification circuit 340 to achieve wide noise margin of the core domain circuits in response to the reset signal. Schmitt triggers can increase VIL and VIH through hysteresis. Because the core domain logic circuits operate at VDDC that is typically much lower than input reset signal sent from a global chip reset circuit, the VIH noise margin is implied in the context of FIG. 3 and therefore, only a half-Schmitt trigger is employed to increase the VIL. The half-Schmitt trigger comprises NMOS 333 and 334. The input of the half-Schmitt trigger is connected to NMOS 342 and the output of the half-Schmitt trigger is connected to the Node 303. In one embodiment, a full Schmitt can be used to increase both VIL and VIH. In another embodiment, other types of suitable circuits may be used to increase the noise margins of the core logic circuits in response to the converted reset signal.

In one embodiment, the protection circuit 310 receives an input reset signal at a VDDH level and outputs a converted reset signal at a reduced voltage level such that the converted reset signal is compatible with the VDDC domain. The reduced voltage level can help reduce or minimize oxide stress issues. The level restoration circuit 320 then receives the converted reset signal and pulls the converted signal to the nominal VDDC level. Thus, a restored reset signal at VDDC level is produced by the level restoration circuit 320. The noise margin circuit 340 functions to increase the noise margins of the core domain logic in response to the restored reset signal to prevent errors caused by noise margin incompatibility. Consequently, core domain logic circuits receive a reset signal at the nominal VDDC level from the reset by-pass circuit with wide noise margins and thereby can be set to reboot status safely. In some embodiments, the VDDH can be the same as VDDO.

When the protection circuit 310 outputs a converted reset signal at 302 as logic high, the inverter outputs a logic low at 303, making the gate of the PMOS 321 logic low and consequently pulling the voltage of its drain to the same level as its source which is VDDC. Thus, the converted reset signal at 302 is restored to the nominal VDDC from VDDC-Vth_thin. The resistor 322 connected in between the drain of the PMOS 321 and node 321 has a large resistance to prevent interference with the input reset signal. In some embodiments, other type of suitable circuit may be used to pull the converted reset signal to the nominal VDD level.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A system comprising:
   a core domain portion configured to operate at a nominal core domain voltage level;
   an I/O domain portion configured to operate at a nominal I/O domain voltage level that is different from said nominal core domain voltage level; and
   a core reset I/O by-pass component configured to forward a reset indication to the core domain portion independent of the I/O domain portion.

2. The system as described in claim 1 wherein the core reset I/O by-pass component is operable to receive an input reset indication at a high domain voltage level and to convert the input reset indication to a core reset signal that is less than or substantially equal to the nominal core domain voltage level, wherein the high domain voltage level is greater than the nominal core domain voltage level.

3. The system as described in claim 2, wherein the core reset I/O by-pass component comprises a reset protection circuit and a level restoration circuit, wherein the level restoration circuit is configured to pull the core reset signal up to the nominal core domain voltage level.

4. The system as described in claim 3, wherein the reset protection circuit comprises a native thick oxide N channel transistor connected in series with a thin channel transistor, wherein both the native thick oxide N channel transistor and the thin channel transistor have a gate coupled to the core domain voltage level; and wherein the native thick oxide N channel transistor has a threshold voltage substantially equal to or less than zero.

5. The system as described in claim 2, wherein the high domain voltage level is equal to the nominal I/O domain voltage level.

6. The system as described in claim 2, wherein the core domain portion is operable to receive the core reset signal before an I/O domain rail associated with the I/O domain portion is powered up.

7. The system as described in claim 1, wherein the core reset I/O by-pass component further comprises a noise margin amplification circuit that comprises a half-Schmitt trigger circuit operable to increase the Voltage-In-Low (VIL) of the core domain portion in response to a converted reset signal.

8. A method comprising:
receiving a reset indication;
performing a core reset I/O by-pass process, wherein the core reset I/O by-pass process comprises forwarding a core reset signal to a core domain in response to the reset indication and independent of an I/O domain, wherein said core domain and said I/O domain operate in different voltage levels; and
resetting the core domain.

9. The method as described in claim 8, wherein the performing a core reset I/O by-pass process includes increasing a noise margin.

10. The method as described in claim 9, wherein the performing a core reset I/O by-pass process includes converting the reset indication to a converted reset signal that is substantially equal to or less than a core domain voltage and pulling the converted reset signal to the core domain voltage.

11. The method as described in claim 10, wherein the reset indication is substantially equal to an I/O domain voltage when received, and wherein the core reset signal is forwarded by the core reset I/O by-pass process substantially equal to or less than the core domain voltage.

12. The method as described in claim 11, wherein the converted reset signal is forwarded to the core domain before the I/O domain is powered up.

13. The method as described in claim 9 wherein increasing the noise margin includes increasing Voltage-Input-Low (VIL).

14. A system comprising:
a core domain circuit configured to operate at a nominal core domain voltage level;
an I/O domain circuit configured to operate at a nominal I/O domain voltage level, wherein the I/O domain circuit comprises an I/O domain rail; and
a core reset I/O by-pass circuit configured to forward a reset indication to the core domain circuit independent of the I/O domain circuit,
wherein the core domain circuit is configured to receive the reset indication before the I/O domain rail is powered up.

15. The system as described in claim 14, wherein the reset indication comprises an input reset signal, wherein the core reset I/O by-pass circuit is operable to receive the input reset signal at a high domain voltage level and to convert the input reset signal to a core reset signal that is less than or substantially equal to the nominal core domain voltage level, wherein the high domain voltage level is greater than the nominal core domain voltage level.

16. The system as described in claim 15, wherein the core reset I/O by-pass circuit comprises a reset protection circuit and a level restoration circuit, wherein the level restoration circuit is operable to pull the core reset signal up to the nominal core domain voltage level.

17. The system as described in claim 16, wherein the reset protection circuit comprises a native thick oxide N channel transistor connected in series with a thin layer transistor, wherein both the native thick oxide N channel transistor and the thin layer transistor have a gate coupled to the core domain voltage level; and wherein the native thick oxide N channel transistor has a threshold voltage substantially equal to or less than zero.

18. The system as described in claim 15, wherein the high domain voltage level is equal to the nominal I/O domain voltage level.

19. The system as described in claim 15, wherein the core reset I/O by-pass circuit further comprises a noise margin amplification circuit configured to increase the Voltage-In-Low (VIL) of the core domain circuit in response to the core reset signal.

20. The system as described in claim 19, wherein the noise margin amplification circuit comprises a half-Schmitt trigger circuit.

* * * * *